(12) United States Patent
Yoshioka et al.

(10) Patent No.: US 9,944,049 B2
(45) Date of Patent: Apr. 17, 2018

(54) COMPOSITION FOR FORMING RELEASE LAYER, RELEASE LAYER, LAMINATE INCLUDING RELEASE LAYER, METHOD OF PREPARING LAMINATE, AND METHOD OF TREATING LAMINATE

(71) Applicant: Tokyo Ohka Kogyo Co., Ltd., Kawasaki-shi (JP)

(72) Inventors: Takahiro Yoshioka, Kawasaki (JP); Koki Tamura, Kawasaki (JP); Hirofumi Imai, Kawasaki (JP); Atsushi Kubo, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 79 days.

(21) Appl. No.: 15/139,920

(22) Filed: Apr. 27, 2016

(65) Prior Publication Data
US 2016/0332421 A1 Nov. 17, 2016

(30) Foreign Application Priority Data
May 14, 2015 (JP) .................. 2015-099426

(51) Int. Cl.
| | |
|---|---|
| B32B 7/06 | (2006.01) |
| B32B 7/12 | (2006.01) |
| C09J 7/02 | (2006.01) |
| C09D 183/00 | (2006.01) |
| H01L 21/683 | (2006.01) |
| B32B 9/04 | (2006.01) |
| C09D 183/06 | (2006.01) |
| C08L 83/04 | (2006.01) |
| B32B 27/28 | (2006.01) |
| C08L 83/06 | (2006.01) |

(52) U.S. Cl.
CPC .................. *B32B 7/06* (2013.01); *B32B 7/12* (2013.01); *B32B 9/04* (2013.01); *C09D 183/00* (2013.01); *C09J 7/0228* (2013.01); *H01L 21/6835* (2013.01); *B32B 27/283* (2013.01); *B32B 2250/02* (2013.01); *B32B 2255/26* (2013.01); *B32B 2307/542* (2013.01); *B32B 2307/748* (2013.01); *B32B 2457/14* (2013.01); *C08L 83/04* (2013.01); *C08L 83/06* (2013.01); *C09D 183/06* (2013.01); *C09J 2483/005* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC B32B 7/06; B32B 7/12; B32B 27/283; B32B 9/04; C09D 183/06; C08L 83/04; C08L 83/06
USPC .......................................... 428/447
See application file for complete search history.

(56) References Cited

U.S. PATENT DOCUMENTS

| | | | | |
|---|---|---|---|---|
| 6,008,310 | A | * | 12/1999 | Itoh ......................... C08L 83/04 524/715 |
| 2012/0118511 | A1 | | 5/2012 | Imai et al. |
| 2013/0302983 | A1 | | 11/2013 | Tanabe et al. |
| 2014/0057450 | A1 | * | 2/2014 | Bourbina ............ H01L 21/6835 438/759 |
| 2014/0166209 | A1 | | 6/2014 | Imai et al. |

FOREIGN PATENT DOCUMENTS

| | | |
|---|---|---|
| JP | 2012-124467 | 6/2012 |
| JP | 2013-235939 | 11/2013 |

OTHER PUBLICATIONS

English language translation JP 2017/216615, Aug. 2007.*

* cited by examiner

Primary Examiner — Margaret G Moore
(74) Attorney, Agent, or Firm — Knobbe Martens Olson & Bear LLP

(57) ABSTRACT

A laminate is formed by laminating a substrate and a support plate through an adhesive layer and a release layer. The release layer is formed by applying a composition containing a reactive polysilsesquioxane and a crosslinkable group-containing siloxane onto the surface of the support plate or the surface of the substrate and heating the composition to polymerize the reactive polysilsesquioxane and the crosslinkable group-containing siloxane.

2 Claims, 1 Drawing Sheet

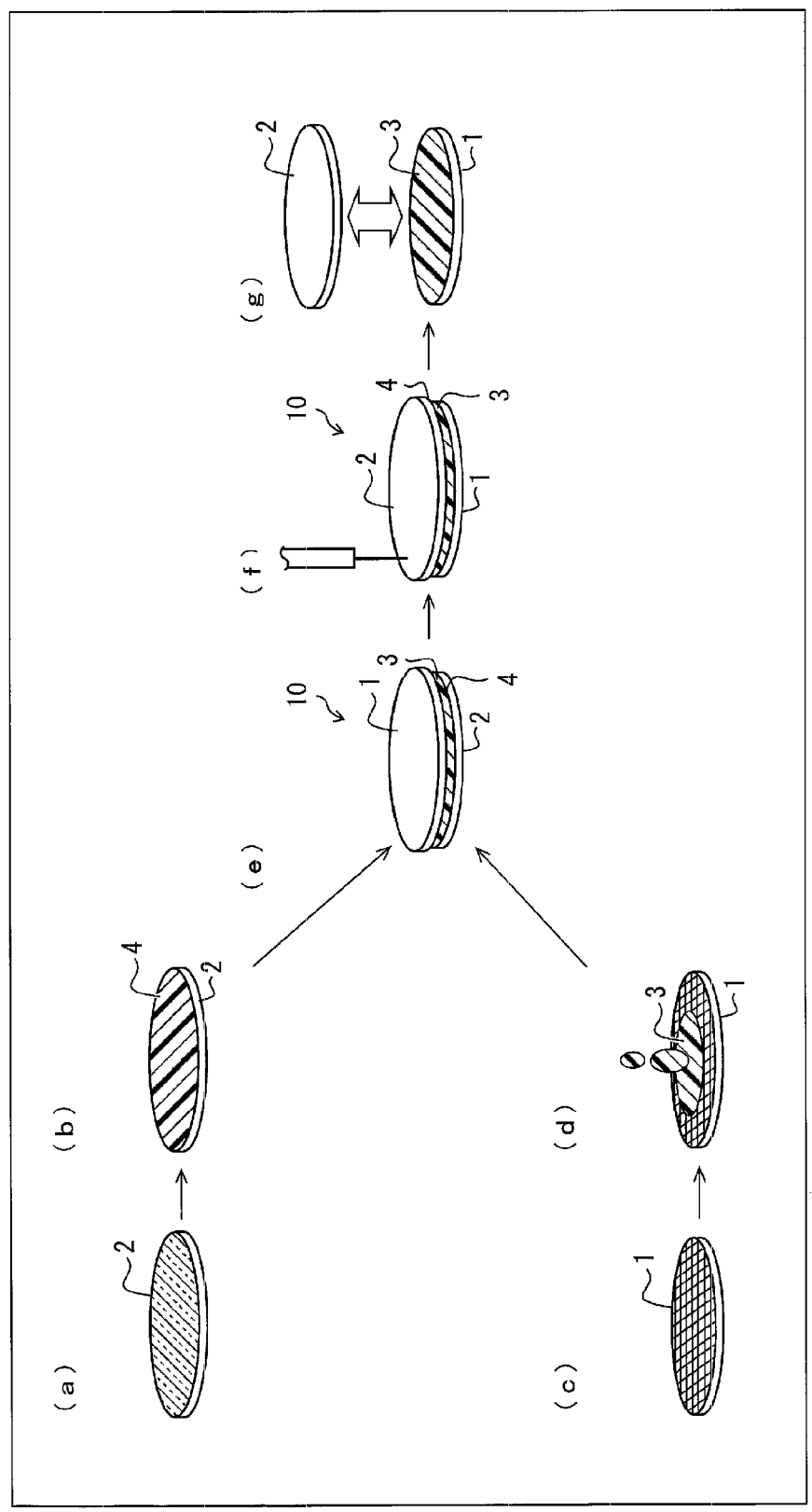

COMPOSITION FOR FORMING RELEASE LAYER, RELEASE LAYER, LAMINATE INCLUDING RELEASE LAYER, METHOD OF PREPARING LAMINATE, AND METHOD OF TREATING LAMINATE

CROSS-REFERENCE TO RELATED APPLICATIONS

Priority is claimed on Japanese Patent Application No. 2015-099426, filed May 14, 2015, the content of which is incorporated herein by reference.

BACKGROUND OF THE INVENTION

Field of the Invention

The present invention relates to a composition for forming a release layer, a release layer, a laminate including the release layer, a method of preparing the laminate, and a method of treating the laminate.

Background Art

In recent years, thinner, smaller, or lighter electronic appliances, such as IC cards, mobile phones, and the like, have been required. In order to meet these requirements, thin semiconductor chips should be used as semiconductor chips to be embedded. Therefore, it is known that the thickness (film thickness) of a wafer substrate, which is a base of a semiconductor chip, is currently 125 μm to 150 μm, but should be 25 μm to 50 μm for next-generation chips. Accordingly, in order to obtain a wafer substrate having the above film thickness, a process of thinning the wafer substrate is necessarily required.

Since the strength of a wafer substrate is lowered by thinning, in order to prevent the damage of the thinned wafer substrate, during a production process, a structure such as a circuit is mounted on the wafer substrate while being automatically carried in a state where a support plate is bonded to the wafer substrate. For example, the formation of a through electrode is performed on the wafer substrate by a lithography process, and the preparation of a semiconductor power device is performed by an ion diffusion process and an annealing process.

In the case where the wafer substrate and the support are strongly adhered, due to an adhesive (adhesive material), it is difficult to separate the support from the wafer substrate without damaging the structure mounted on the wafer substrate. Therefore, the very difficult development of a temporary fixing technology for achieving a strong adhesion between the wafer substrate and the support during the production process and, after the production process, separating the support from the wafer substrate without damaging the structure, such as an element, mounted on the wafer substrate has been required.

It is disclosed in JP-A-2013-235939 (published Nov. 21, 2013) that a second temporary adhesive layer composed of a thermosetting modified siloxane polymer layer attachable to or separable from a support plate is provided, and the support plate is separated from a wafer substrate by heating the second temporary adhesive layer or applying mechanical stress to the second temporary adhesive layer.

Further, it is disclosed in JP-A-2012-124467 (published Jun. 28, 2012) that a release layer containing a silsesquioxane skeleton, a siloxane skeleton or an alkoxytitanium skeleton is provided, and a support plate is separated from a wafer substrate by altering the release layer by irradiation with light.

SUMMARY OF THE INVENTION

JP-A-2013-235939 does not disclose the technical content related to a case that a thermosetting modified siloxane polymer layer is used as a release layer which is to alter by irradiation with light.

Further, in a wafer handling system in which a laminate is formed and various treatments are performed on a substrate, a laminate provided with a release layer having further higher chemical resistance and heat resistance than the laminate disclosed in JP-A-2012-124467 is required.

The present inventors of the present application, in view of the above-mentioned problems, have developed a laminate including a release layer formed of a polymer of a reactive polysilsesquioxane and related technologies thereof, as a laminate provided with a release layer having high chemical resistance and high heat resistance and related technologies thereof.

The above laminate including a release layer formed of a polymer of a reactive polysilsesquioxane has excellent chemical resistance, but the chemical resistance of the release layer itself is low. For this reason, there is a problem in that the edge portion of the release layer is peeled, and an adhesive flows in a subsequent thermal process to directly bond a support and a substrate without interposing the release layer, thereby making the peeling of the support from the substrate difficult.

The present invention has been made in view of the above-mentioned problems, and a main object thereof is to provide a release layer having high chemical resistance, a laminate including the release layer, and related technologies thereof.

According to an aspect of the present invention, there is provided a method of preparing a laminate formed by laminating a substrate and a light-transmissive support through an adhesive layer and a release layer which capable of being altered by light absorption, including: applying a composition containing a reactive polysilsesquioxane and a crosslinkable group-containing siloxane onto the surface of the support or the surface of the substrate, and heating the composition to polymerize the reactive polysilsesquioxane and the crosslinkable group-containing siloxane, thereby forming the release layer on the surface of the support or the surface of the substrate.

According to another aspect of the present invention, there is provided a method of treating a substrate, including: applying a composition containing a reactive polysilsesquioxane and a crosslinkable group-containing siloxane onto a substrate or a support made of silicon, and heating the composition to polymerize the reactive polysilsesquioxane and the crosslinkable group-containing siloxane, thereby forming a release layer capable of being altered by light absorption; laminating the substrate and the support through an adhesive layer and the release layer, thereby preparing a laminate; after preparing the laminate, irradiating the release layer with light having a wavelength falling within the range of 9 μm to 11 μm to alter the release layer; and separating the support from the laminate.

According to still another aspect of the present invention, there is provided a composition for forming a release layer, including a reactive polysilsesquioxane and a crosslinkable group-containing siloxane.

According to the present invention, the release layer itself has high chemical resistance. Therefore, there can be provided a laminate provided with a release layer which has high heat resistance and high chemical resistance and which does not cause the peeling even at the edge portion thereof when being dipped in chemicals, and related technologies thereof.

BRIEF DESCRIPTION OF THE DRAWING

FIG. 1 is a schematic view showing a method of preparing a laminate and a method of treating a substrate according to an embodiment of the present invention.

DETAILED DESCRIPTION OF THE INVENTION

Method of Preparing Laminate

A method of preparing a laminate 10 according to an embodiment of the present invention will be described in detail with reference to (a) to (e) of FIG. 1.

As shown in (a) and (b) of FIG. 1, the method of preparing a laminate 10 according to the present embodiment includes a release layer-forming process of applying a solution containing a reactive polysilsesquioxane and a crosslinkable group-containing siloxane onto the surface of a support plate 2 or the surface of a substrate 1, and heating the solution to polymerize the reactive polysilsesquioxane and the crosslinkable group-containing siloxane, thereby forming a release layer 4.

Here, the solution containing the reactive polysilsesquioxane and the crosslinkable group-containing siloxane may further include a thermal acid generator as a polymerization initiator. The thermal acid generator may be any compound that generates an acid (H$^+$) by heating, and example thereof includes K-PURE CXC-1821. The polymerization of the crosslinkable group-containing siloxane can be appropriately caused by the generated acid (H$^+$).

The thermal acid generator may be appropriately selected from commonly known ones, and examples thereof may include cationic or protonic acid catalysts, such as trifluoromethane sulfonate, a boron trifluoride ether complex compound, hexafluoride phosphate, perfluorobutane sulfonic acid, and boron trifluoride. Among these, hexafluoride phosphate, trifluoromethane sulfonic acid, and perfluorobutane sulfonic acid are preferable, and trifluoromethane sulfonic acid is more preferable.

Examples thereof include trifluoromethanesulfonic acid diethyl ammonium, trifluoromethane sulfonic acid triethylammonium, trifluoromethanesulfonic acid diisopropyl ammonium, and trifluoromethane sulfonic acid ethyl diisopropyl ammonium. Among aromatic onium salts also used as an acid generator, there are aromatic onium salts that generate cationic species by heat, and these aromatic onium salts can also be used as a thermal cationic polymerization initiator. Examples thereof include SANAID SI-45, SI-47, SI-60, SI-60L, SI-80, SI-80L, SI-100, SI-100L, SI-110L, SI-145, SI-150, SI-160, SI-180L, SI-B3, and SI-B3A (all, manufactured by SANSHIN CHEMICAL INDUSTRY CO., LTD.). In addition, examples thereof include CI-2921, CI-2920, CI-2946, CI-3128, CI-2624, CI-2639, and CI-2064 (all, manufactured by NIPPON SODA CO., LTD.); CP-66 and CP-77 (all, manufactured by ADEKA CORPORATION); FC-520 (manufactured by 3M COMPANY); and K-PURE TAG-2396, TAG-27135, TAG-2713, TAG-2172, TAG-2179, TAG-2168E, TAG-2722, TAG-2507, TAG-2678, TAG-2681, TAG-2679, TAG-2690, TAG-2700, TAG-2710, TAG-2100, CDX-3027, CXC-1615, CXC-1616, CXC-1750, CXC-1738, CXC-1614, CXC-1742, CXC-1743, CXC-1613, CXC-1739, CXC-1751, CXC-1766, CXC-1763, CXC-1736, CXC-1756, CXC-1821, and CXC-1802-60 (all, manufactured by KING INDUSTRY CO., LTD.).

Among the above-described thermal acid generators, trifluoromethane sulfonate or hexafluoride phosphate is preferable, and trifluoromethane sulfonate is more preferable.

According to the above configuration, it is possible to form the release layer 4 on the support plate 2 using a polymer of the reactive polysilsesquioxane and the crosslinkable group-containing siloxane. In the release layer-forming process, high chemical resistance and high heat resistance can be imparted to the entire release layer 4 having an edge portion by polymerizing the reactive polysilsesquioxane and the crosslinkable group-containing siloxane.

The method of preparing a laminate 10 according to the present embodiment includes: an adhesive layer-forming process of forming an adhesive layer 3 on the substrate 1 (refer to (c) and (d) of FIG. 1); and a laminating process of laminating the substrate 1 and the support plate 2 through the adhesive layer 3 and the release layer 4 (refer to (e) of FIG. 1).

Thus, it is possible to prepare a laminate 10 provided with the release layer 4 having high chemical resistance and high heat resistance.

Further, in the method of preparing a laminate 10 according to the present embodiment, a laminate 10 in which a substrate 1 made of silicon is supported by a support plate 2 made of silicon is prepared.

Release Layer-Forming Process

In the release layer-forming process, a solution in which a composition containing the reactive polysilsesquioxane and the crosslinkable group-containing siloxane is dissolved in a solvent is applied onto a support plate 2 shown in (a) of FIG. 1. Then, the reactive polysilsesquioxane and the crosslinkable group-containing siloxane are polymerized by heating the support plate 2 coated with the solution. Thus, as shown in (b) of FIG. 1, a release layer 4 is formed on the support plate 2.

Further, in the release layer-forming process, a solution in which a composition containing the reactive polysilsesquioxane and the crosslinkable group-containing siloxane is dissolved in a solvent can be applied onto a substrate 1 instead of applying the solution onto the support plate 2.

Regarding the application of the solution, it is preferable that the solution is applied to the surface of the support plate 2, the surface facing the substrate 1.

In order to initiate the polymerization by heating, it is preferable that the composition contains a thermal acid generator as described above as a polymerization initiator.

As the method for applying the solution of the composition containing the reactive polysilsesquioxane and the crosslinkable group-containing siloxane onto the support plate 2 or the substrate 1, for example, spin coating, dipping, roller blade, spray coating, and slit coating can be exemplified. The concentration of the reactive polysilsesquioxane in the solution may be appropriately adjusted according to the application method of the solution, but may be within the range of 1% by weight to 80% by weight. Further, the concentration of the crosslinkable group-containing siloxane in the solution may be appropriately adjusted according to the application method of the solution, but may be within the range of 10% by weight to 60% by weight.

In the release layer-forming process, the reactive polysilsesquioxane and the crosslinkable group-containing siloxane on the support plate 2 or the substrate 1 are polymerized by heating the composition containing the reactive polysilsesquioxane and the crosslinkable group-containing siloxane applied on the support plate 2 or the substrate 1. Thus, the reactive polysilsesquioxane molecules and the crosslinkable group-containing siloxane molecules for forming the release layer 4 are crosslinked with each other, thereby improving the chemical resistance and heat resistance of the release layer 4.

In the release layer-forming process, the temperature for heating the reactive polysilsesquioxane and the crosslinkable group-containing siloxane is preferably 100° C. to 500° C., and more preferably 200° C. to 400° C. When the reactive polysilsesquioxane and the crosslinkable group-containing siloxane are heated at a temperature of 100° C. to 500° C., the reactive polysilsesquioxane and the crosslinkable group-containing siloxane can be appropriately polymerized, and the chemical resistance and heat resistance of the release layer 4 can be improved.

The time taken to heat the reactive polysilsesquioxane and the crosslinkable group-containing siloxane is preferably 1 minute to 120 minutes, and more preferably 3 minutes to 10 minutes. When the time taken to heat the reactive polysilsesquioxane and the crosslinkable group-containing siloxane is 1 minute to 120 minutes, the reactive polysilsesquioxane and the crosslinkable group-containing siloxane preferably react with each other, and a solvent is evaporated from the release layer 4 by heat to sufficiently remove the solvent. In addition, water, which is a by-product generated at the time of polymerizing the reactive polysilsesquioxane and the crosslinkable group-containing siloxane, can be appropriately removed. Therefore, it is possible to prevent voids from being generated between the support plate 2 or the substrate 1 and the release layer 4 by the solvent or water remaining in the release layer 4 after the formation of the laminate 10.

The thickness of the release layer 4, for example, is preferably 0.05 µm to 50 µm, and more preferably 0.3 µm to 1 µm. When the thickness of the release layer 4 is within the range of 0.05 µm to 50 µm, the release layer 4 can be treated without problems in a thermal process or at the time of peeling. Further, the thickness of the release layer 4 is particularly preferably within the range of 10 µm or less, from the viewpoint of productivity.

Support Plate 2

The support plate (support) 2 is used for supporting the substrate 1 in order to prevent the damage or deformation of the substrate 1 at the time of processes, such as thinning, transporting and mounting of the substrate 1 (refer to (a) of FIG. 1).

In the method of preparing a laminate according to the present embodiment, the support plate 2 can transmit light to alter the release layer. The support plate 2 capable of transmitting light can be formed by a material containing silicon. The substrate 1 can be appropriately supported by using the support plate 2 made of silicon. The support plate 2 made of silicon can appropriately transmit the light having a wavelength at which the release layer 4 obtained by polymerizing the reactive polysilsesquioxane and the crosslinkable group-containing siloxane can be altered.

Release Layer 4

The release layer 4 is a layer formed by heating and polymerizing the reactive polysilsesquioxane and the crosslinkable group-containing siloxane, and can be altered by irradiation with light.

In the present specification, the "release layer 4 being altered" means a phenomenon in which the release layer 4 can be destroyed by receiving a slight external force or the adhesion force between the release layer 4 and a layer in contact with the release layer 4 is lowered. As the result of alteration of the release layer 4 caused by absorbing light, the release layer 4 loses strength or adhesiveness before irradiation with light. That is, the release layer 4 becomes brittle by absorbing light. The alteration of the release layer 4 means that the polymer of the reactive polysilsesquioxane and the crosslinkable group-containing siloxane in the release layer 4 causes decomposition, change of configuration, or dissociation of a functional group by energy of absorbed light. The alteration of the release layer occurs as a result of absorbing light.

Thus, for example, it is possible to easily separate the support plate 2 from the substrate 1 by altering the release layer 4 such that the release layer 4 is destroyed only by lifting the support plate 2. More specifically, for example, one of the substrate 1 and the support plate 2 in the laminate 10 is fixed to a mounting stage by a support separation apparatus, and the other thereof is held and lifted by an adsorption pad (holding unit) provided with adsorption unit, thereby separating the support plate 2 from the substrate 1. Further, the support plate 2 may be separated from the substrate 1 by applying a force by gripping the chamfered portion of end of periphery of the support plate 2 using a separation plate provided with a clamp (claw portion). Moreover, for example, the support plate 2 may be peeled from the substrate 1 in the laminate 10 by a support separation apparatus provided with a peeling unit for supplying a peeling solution for peeling an adhesive. The peeling solution is supplied to at least a portion of the periphery of an adhesive layer 3 in the laminate 10 by the peeling unit to swell the adhesive layer 3 in the laminate 10, so that a force is concentrated to the release layer 4 from the place where the adhesive layer 3 is swelled, thereby applying the force to the substrate 1 and the support plate 2. Therefore, it is possible to appropriately separate the support plate 2 from the substrate 1.

The force externally applied to the laminate, that is, external force may be appropriately adjusted depending on the size of the laminate and the material quality of the support plate (support) made of glass and silicon. The force is not particularly limited, but may be about 0.1 kgf to 5 kgf if the laminate has a diameter of about 300 mm. It is possible to appropriately separate the support plate from the substrate by applying the external force of 0.1 kgf to 5 kgf.

Here, as the method of applying the above-described force to the laminate, for example, preferably, the separation plate is lifted at a speed of 0.05 mm/s to 0.5 mm/s in a state where the support plate 2 is gripped, and more preferably, the separation plate is lifted at a speed of 0.1 mm/s to 0.2 mm/s.

When the separation plate is lifted at a speed of 0.05 mm/s to 0.5 mm/s in a state where the support plate 2 is gripped, it is possible to prevent excessive force from being applied to the support plate 2 and the substrate 1 at once. Therefore, it is possible to strip the substrate 1 and the support plate 2 at the interface between the support plate 2 and the release layer 4 (refer to (e) and (f) of FIG. 1). In addition, since it is possible to prevent excessive force from being applied to the support plate 2 and the substrate 1 at once, it is possible to prevent the substrate 1 and the support plate 2 from being destroyed.

Reactive Polysilsesquioxane

In the present specification, the reactive polysilsesquioxane is polysilsesquioxane having a silanol group or a functional group capable of forming the silanaol group by hydrolysis at the end of a polysilsesquioxane skeleton, and the silianol group and the functional group capable of forming the silanaol group can be polymerized with each other by condensing the silanol group or the functional group. If the reactive polysilsesquioxane is provided with the silianol group and the functional group capable of forming the silanaol group, it is possible to adopt a reactive polysilsesquioxane having a silsesquioxane skeleton of a random structure, a cage structure, or a ladder structure.

It is preferable that the reactive polysilsesquioxane has a structure represented by the following formula (1).

[Chemical formula 1]

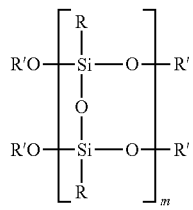

(1)

In formula (1), R each is independently selected from the group consisting of a hydrogen atom and an alkyl group having 1 to 10 carbon atoms, and, more preferably, selected from the group consisting of a hydrogen atom and an alkyl group having 1 to 5 carbon atoms. When each of R's is a hydrogen atom and an alkyl group having 1 to 10 carbon atoms, the reactive polysilsesquioxane represented by formula (1) can be preferably condensed by heating in the release layer-forming process.

In formula (1), m is preferably an integer of 1 to 100, and more preferably an integer of 1 to 50. Since the reactive polysilsesquioxane is provided with a repeating unit represented by formula (1), the content of Si—O bonds is high compared to that of Si—O bonds formed by using other materials, and thus it is possible to form a release layer 4 having high absorbance at infrared wavelengths (0.78 μm to 1000 μm), preferably far-infrared wavelengths (3 μm to 1000 μm), more preferably a wavelength falling within the range of 9 μm to 11 μm.

In formula (1), plural Rs each independently an organic group and are the same as or different from each other. Here, examples of R may include an aryl group, an alkyl group, and an alkenyl group, and each of these organic groups may have a substituent.

In the case where R is an aryl group, a phenyl group, a naphthyl group, an anthryl group, and a phenanthryl group can be exemplified, and a phenyl group is more preferable. The aryl group may be bonded to a polysilsesquioxane skeleton through an alkylene group having 1 to 5 carbon atoms.

In the case where R is an alkyl group, the alkyl group can be a linear, branched, or cyclic alkyl group. Further, in the case where R is an alkyl group, the alkyl group is preferably an alkyl group having 1 to 15 carbon atoms, and more preferably an alkyl group having 1 to 6 carbon atoms. Moreover, in the case where R is a cyclic alkyl group, the cyclic alkyl group may be an alkyl group having a monocyclic structure or dicyclic to tetracyclic structures.

In the case where R is an alkenyl group, the alkenyl group, similarly to the alkyl group, can be a linear, branched, or cyclic alkenyl group. The alkenyl group is preferably an alkenyl group having 2 to 15 carbon atoms, and more preferably an alkenyl group having 2 to 6 carbon atoms. Further, in the case where R is a cyclic alkenyl group, the cyclic alkenyl group may be an alkenyl group having a monocyclic structure or dicyclic to tetracyclic structures. Examples of the alkenyl group can include a vinyl group and an allyl group.

As the substituent which R may have, a hydroxyl group and an alkoxy group can be exemplified. In the case where the substituent is an alkoxy group, the alkoxy group may be a linear, branched, or cyclic alkylalkoxy group, and the number of carbon atoms in the alkoxy group is preferably 1 to 15, and more preferably 1 to 10.

In one aspect, the content of siloxane in the reactive polysilsesquioxane is preferably 70 mol % to 99 mol %, and more preferably 80 mol % to 99 mol %. If the content of siloxane in the reactive polysilsesquioxane is 70 mol % to 99 mol %, it is possible to form a release layer that can be preferably altered by irradiation with infrared light (preferably far-infrared light, more preferably light having a wavelength falling within the range of 9 μm to 11 μm).

Further, in one aspect, the average molecular weight (Mw) of the reactive polysilsesquioxane is preferably 500 to 50000, and more preferably 1,000 to 10,000. If the average molecular weight (Mw) of the reactive polysilsesquioxane is 1,000 to 10,000, the reactive polysilsesquioxane can be preferably dissolved in a solvent, and can be appropriately applied onto the support.

Examples of commercially available products that can be used as the reactive polysilsesquioxane may include SR-13, SR-21, SR-23, and SR-33, manufactured by KONISHI CHEMICAL IND CO., LTD.

Crosslinkable Group-Containing Siloxane

In the present specification, the crosslinkable group-containing siloxane is a compound having a crosslinkable group at the side chain of a siloxane skeleton, as represented by general formula (a) below. Examples of the crosslinkable group include an epoxy group, an alkoxy group, a carboxyl group, a carbonyl group, and a hydroxyl group. Among these, an epoxy group is preferable. The reactive polysilsesquioxane and the crosslinkable group-containing siloxane are described as preferable ones. In the point that the structure represented by the general formula (1) above and the structure represented by general formula (a) below are clearly different from each other, and, particularly, in the point that the structure represented by general formula (1) above is a ladder-type structure, both the reactive polysilsesquioxane and the crosslinkable group-containing siloxane are materials different from each other. Further, in the point that the kinds of side chains bonded to main chains composed of Si—O bonds in both of them are different from each other, that is, in the point that the side chain of the crosslinkable group-containing siloxane includes a crosslinkable group, and preferably an epoxy group, both the reactive polysilsesquioxane and the crosslinkable group-containing siloxane are materials different from each other.

$$-(SiO_{2/3}(R^1))_m-(SiO_{2/3}(R^2))_n- \quad (a)$$

In the formula (a), $R^1$ is a crosslinkable group, and $R^2$ is selected from an alkyl group and an aryl group. Each of m and n represents a mol percentage of subscript-attached structural units to all structural units in the polysiloxane, and n+m=100% and n>0.

In the crosslinkable group-containing siloxane of the present invention, crosslinkable groups are crosslinked and polymerized with each other by heating, so as to form a polymer. At that time, if the solution containing the crosslinkable group-containing siloxane of the present invention further contains a thermal acid generator, the crosslinking polymerization of the above-described cationically polymerizable crosslinkable groups appropriately occurs.

In the process of forming the release layer 4, the crosslinkable group-containing siloxane of the present invention is used in combination with the reactive polysilsesquioxane.

Since the crosslinkable group-containing siloxane of the present invention, similarly to the reactive polysilsesquioxane, has Si—O bonds in a siloxane skeleton, the release layer 4 composed of a polymer of the reactive polysilsesquioxane and the crosslinkable group-containing siloxane can exhibit laser reactivity and laser absorptivity which are comparable to those of the release layer composed of a polymer of the reactive polysilsesquioxane.

Further, the crosslinkable group existing at the side chain of the crosslinkable group-containing siloxane is configured such that crosslinking polymerization occurs between molecules, and thus it is possible to improve the chemical resistance of the release layer 4 itself containing the polymer of the crosslinkable group.

From the viewpoint of sufficiently improving the chemical resistance of the release layer 4 itself, the amount of the crosslinkable group-containing siloxane used in the release layer 4 is preferably 10% by weight to 99% by weight, and more preferably 20% by weight to 80% by weight with respect to the total weight of the reactive polysilsesquioxane and the crosslinkable group-containing siloxane.

In terms of preparing a laminate including the release layer 4 excellent in physical properties such as laser reactivity and heat resistance, the crosslinkable group-containing siloxane is preferably epoxy siloxane represented by the following general formula (a1).

[Chemical formula 2]

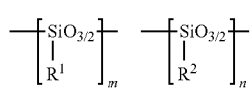

(a1)

In general formula (a1), $R^1$ is a crosslinkable group, $R^2$ is an alkyl group or an aryl group, each of subscripts m and n represents a mol percentage of the subscript-attached structural units to all structural units in the polysiloxane, m is 50 mol % to 90 mol %, and n is 10 mol % to 50 mol %. Here, the sum of m and n is 100 mol %.

As the crosslinkable group in $R^1$, an epoxy group, an oxetanyl group, an epoxy group-containing group, or an oxetanyl group-containing group is exemplified. As the epoxy group-containing or oxetanyl group-containing group, an alkylene group having 1 to 5 carbon atoms or a group bonded to an epoxy group or an oxetanyl group through an oxygen atom is exemplified.

Examples of the epoxy siloxane include polymer E and polymer F represented by the following formulae, respectively, and trade names X-22-2046 and KF-102 manufactured by Shin-Etsu Silicone CO., Ltd.

Polymer E: a polymer represented by the following formula (a2) (weight average molecular weight: 1,000 to 20,000)

[Chemical formula 3]

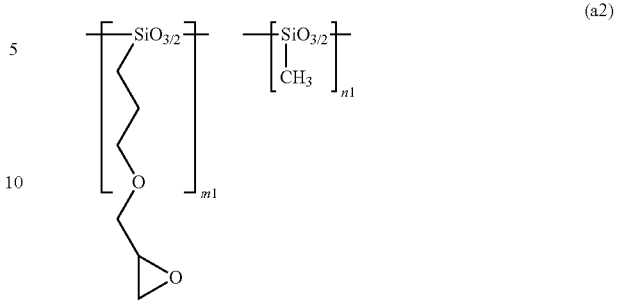

(a2)

In formula (a2), each of subscripts m1 and n1 represents a mol percentage of the subscript-attached structural units to all structural units in the polymer E, m1 is 50 mol % to 90 mol %, and n1 is 10 mol % to 50 mol %. Here, the sum of m1 and n1 is 100 mol %.

Polymer F: a polymer represented by the following formula (a3) (weight average molecular weight: 1,000 to 20,000)

[Chemical formula 4]

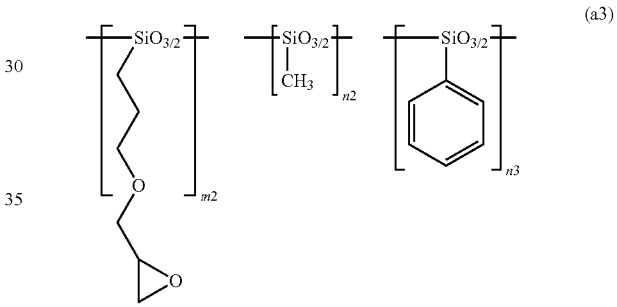

(a3)

In formula (a3), each of subscripts m2, n2, and n3 represents a mol percentage of the subscript-attached structural units to all structural units in the polymer F, m2 is 50 mol % to 90 mol %, n2 is 1 mol % to 10 mol %, and n3 is 5 mol % to 50 mol %. Here, the sum of m2, n2, and n3 is 100 mol %.

Solvent

The solvent may be a solvent capable of dissolving the reactive polysilsesquioxane and the crosslinkable group-containing siloxane. A solvent shown below can be used.

Examples of the solvent may include: latones, such as γ-butyrolactone; ketones, such as acetone, methyl ethyl ketone, cyclohexanone (CH), methyl-n-pentyl ketone, methyl isopentyl ketone, and 2-heptanone; polyhydric alcohols, such as ethylene glycol, diethylene glycol, propylene glycol, and dipropylene glycol; derivatives of polyhydric alcohols, such as compounds having an ester bond (for example, ethylene glycol monoacetate, diethylene glycol monoacetate, propylene glycol monoacetate, and dipropylene glycol monoacetate), and compounds having an ether bond (for example, monoalkyl ethers (such as monomethyl ether, monoethyl ether, monopropyl ether, and monobutyl ether) or monophenyl ethers of the polyhydric alcohols and the compounds having an ester bond); cyclic ethers, such as dioxane; esters, such as methyl lactate, ethyl lactate (EL), methyl acetate, ethyl acetate, butyl acetate, methoxybutyl acetate, methyl pyruvate, ethyl pyruvate, methyl methoxypropionate, and ethyl ethoxypropionate; and aromatic organic solvents, such as anisole, ethyl benzyl ether, cresyl methyl ether, diphenyl ether, dibenzyl ether, phenetole, and butyl phenyl ether.

As the solvent, derivatives of polyhydric alcohols are preferable. Examples of derivatives of polyhydric alcohols include propylene glycol monomethyl ether acetate (PG-MEA) and propylene glycol monomethyl ether (PGME). PGMEA or PGME is preferable, and PGMEA is more preferable.

Adhesive Layer-Forming Process

In the process of forming an adhesive layer, an adhesive is applied onto a substrate 1 shown in (c) of FIG. 1, so as to form an adhesive layer 3 (refer to (d) of FIG. 1).

The adhesive layer 3 is used to bond the substrate 1 and the support plate 2. The adhesive layer 3 can be formed by applying an adhesive by a method, such as spin coating, dipping, roller blade, spray coating, or slit coating. In addition, the adhesive layer 3 may be formed by bonding a film previously coated with an adhesive on both sides thereof (so called, double-sided tape) to the substrate 1 instead of directly applying the adhesive onto the substrate 1.

The thickness of the adhesive layer 3 may be appropriately set depending on the kind of the substrate 1 and the support plate 2 to be bonded with each other or the treatment to be carried out to the substrate 1 after bonding, but is preferably within the range of 10 μm to 150 μm, and more preferably with the range of 15 μm to 100 μm.

Substrate 1

The substrate 1 may be subjected to a process of thinning, mounting, or the like while being supported by the support plate 2. In the method of preparing a laminate according to the present embodiment, a silicon wafer can be used as the substrate 1. The silicon wafer may be mounted with a structure, such as an integrated circuit or a metal bump, on the surface thereof.

Adhesive Layer 3

The adhesive layer 3 is used to bond the substrate 1 and the support plate 2.

As an adhesive for forming the adhesive layer 3, various adhesives well known in the art, such as a polysulfone-based resin, an acrylic resin, a novolak-based resin, a naphthoquinone-based resin, a hydrocarbon-based resin, a polyimide-based resin, and an elasomer resin, can be used. A polysulfone-based resin, a hydrocarbon-based resin, an acryl-styrene-based resin, a maleimide-based resin, an elastomer resin, or a combination thereof can be more preferably used.

Polysulfone-Based Resin

In the method of preparing a laminate according to an embodiment of the present invention, it is preferable that the adhesive for forming the adhesive layer 3 contains a polysulfone-based resin. In the case where the adhesive layer 3 is formed by the polysulfone-based resin, even though the laminate 10 is treated at high temperature, the adhesive layer can be dissolved in a subsequent process, and thus a laminate 10 capable of peeling the support plate from the substrate can be prepared.

The polysulfone-based resin has a structure composed of at least one structural unit of a polysulfone structural unit represented by the following general formula (2) and a polyether sulfone structural unit represented by the following general formula (3).

[Chemical formula 5]

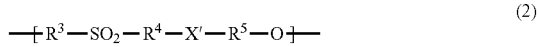

$R^3$, $R^4$, and $R^5$ in general formula (2) and $R^3$ and $R^4$ in general formula (3) each are independently selected from the group consisting of a phenylene group, a naphthylene group, and an anthrylene group, and X' is an alkylene group having 1 to 3 carbon atoms.

Since the polysulfone-based resin has at least one of a polysulfone structural unit represented by formula (2) and a polyether sulfone structural unit represented by formula (3), even though the substrate 1 is treated under a high-temperature condition after bonding the substrate 1 and the support plate 2, it is possible to form a laminate 10 capable of preventing the adhesive layer 3 from being insolubilized by decomposition and polymerization. The polysulfone-based resin, as long as it is a polysulfone resin composed of polysulfone structural units represented by tformula (2), is stable even when being heated to higher temperature. Therefore, it is possible to prevent the residues caused by the adhesive layer from being generated on the substrate after cleaning.

The average molecular weight (Mw) of the polysulfone-based resin is preferably within the range of 30,000 to 70,000, and more preferably within the range of 30,000 to 50,000. If the average molecular weight (Mw) of the polysulfone-based resin is within the range of 30,000 or more, it is possible to obtain an adhesive composition that can be used at a high temperature of 300° C. or higher. Further, if the average molecular weight (Mw) of the polysulfone-based resin is within the range of 70,000 or less, the polysulfone-based resin can be appropriately dissolved by a solvent. That is, it is possible to obtain an adhesive composition that can be appropriately removed by a solvent.

Hydrocarbon Resin

The hydrocarbon resin is a resin having a hydrocarbon skeleton and obtained by polymerizing a monomer composition. Examples of the hydrocarbon resin include, but are not limited to, a cycloolefin-based polymer (hereinafter, referred to as "resin (A)") and at least one resin (hereinafter, referred to as "resin (B)") selected from the group consisting of terpene resin, rosin resin, and petroleum resin.

The resin (A) may be a resin obtained by polymerizing a monomer component containing a cycloolefin-based monomer. Specifically, as the resin (A), a ring-opening (co) polymer of a monomer component containing a cycloolefin-based monomer, or a resin obtained by addition-(co) polymerizing a monomer component containing a cycloolefin-based monomer is exemplified.

Examples of the cycloolefin-based monomer contained in the monomer component constituting the resin (A) include bicyclic monomers, such as norbornene and norbornadiene; tricyclic monomers, such as dicyclopentadiene and hydroxy dicyclopentadiene; tetracyclic monomers, such as tetracyclododecene; pentacyclic monomers, such as cyclopentadiene trimer; heptacyclic monomers, such as tetracyclopentadiene; and alkyl (methyl, ethyl, propyl, butyl, etc.) substitution products, alkenyl (vinyl, etc.) substitution products, alkylidene (ethylidene, etc.) substitution products, and aryl (phenyl, tolyl, naphthyl, etc.) substitution products of these polycyclic monomers. Among these, particularly, a norbonene-based monomer selected from the group consisting of norbonene, tracyclododecene, and alkyl substitution products thereof is preferable.

The monomer component constituting the resin (A) may contain other monomers copolymerizable with the above-described cycloolefin-based monomers, and, preferably, may contain an alkene monomer. Examples of the alkene monomer include ethylene, propylene, 1-butene, isobutene, 1-hexene, and α-olefin. The alkene monomer may be a linear alkene monomer, and may also be a branched alkene monomer.

It is preferable that the monomer component constituting the resin (A) contains a cycloolefin monomer from the viewpoint of high heat resistance (low thermal composition, thermal weight reduction). The ratio of the cycloolefin monomer to the entire monomer component constituting the resin (A) is preferably 5 mol % or more, more preferably 10 mol % or more, and further preferably 20 mol % or more. The ratio of the cycloolefin monomer to the entire monomer component constituting the resin (A) is not particularly limited, but is preferably 80 mol % or less, and more preferably 70 mol % or less, from the viewpoint of solubility and temporal stability in solution.

The monomer component constituting the resin (A) may contain a linear or branched alkene monomer. The ratio of the alkene monomer to the entire monomer component constituting the resin (A) is preferably 10 mol % to 90 mol %, more preferably 20 mol % to 85 mol %, and further preferably 30 mol % to 80 mol %, from the viewpoint of solubility and flexibility.

It is preferable in terms of preventing the generation of gas at high temperature that the resin (A), similarly to a resin obtained by polymerizing a monomer component containing a cycloolefin monomer and an alkene monomer, is a resin having no polar group.

The polymerization method or polymerization condition at the time of polymerizing the monomer component is not particularly limited, and may be appropriately set according to a general method.

Examples of commercially available products that can be used as the resin (A) include "TOPAS" manufactured by Polyplastics Co., Ltd., "APEL" manufactured by Mitsui Chemicals, Inc., "ZEONOR" and "ZEONEX" manufactured by ZEON CORPORATION, and "ARTON" manufactured by JSR Corporation.

The glass transition temperature (Tg) of the resin (A) is preferably 60° C. or higher, and particularly preferably 70° C. or higher. If the glass transition temperature (Tg) of the resin (A) is 60° C. or higher, the softening of the adhesive layer 3 can be further prevented when the laminate is exposed to a high-temperature environment.

The resin (B) is at least one resin selected from the group consisting of terpene-based resin, rosin-based resin, and petroleum resin. Specifically, examples of the terpene-based resin include terpene resin, terpene phenol resin, modified terpene resin, hydrogenated terpene resin, and hydrogenated terpene phenol resin. Examples of the rosin-based rein include rosin, rosin ester, hydrogenated rosin, hydrogenated rosin ester, polymerized rosin, polymerized rosin ester, and modified rosin. Examples of the petroleum resin include aliphatic or aromatic petroleum resin, hydrogenated petroleum resin, modified petroleum resin, alicyclic petroleum resin, and coumarone-indene petroleum resin. Among these, hydrogenated terpene resin and hydrogenated petroleum resin are more preferable.

The softening point of the resin (B) is not particularly limited, but is preferably 80° C. to 160° C. If the softening point of the resin (B) is 80° C. to 160° C., the softening of the laminate can be further prevented when the laminate is exposed to a high-temperature environment, and adhesion failure does not occur.

The weight average molecular weight of the resin (B) is not particularly limited, but is preferably 300 to 3,000. If the weight average molecular weight of the resin (B) is 300 or more, heat resistance becomes sufficient, and the degassing amount in a high-temperature environment decreases. Further, if the weight average molecular weight of the resin (B) is 3,000 or less, the dissolution rate of the adhesive layer to the hydrocarbon solvent is improved. Therefore, the residues of the adhesive layer on the substrate after separating the support can be rapidly dissolved and removed. In the present embodiment, the weight average molecular weight of the resin (B) means a polystyrene-converted molecular weight measured by gel permeation chromatography (GPC).

As the resin, a mixture of the resin (A) and the resin (B) may be used. Heat resistance is improved by mixing the resin (A) and the resin (B). For example, the mixing ratio of the resin (A) and the resin (B) satisfies (A):(B)=80:20 to 55:45 (mass ratio), but is excellent in heat resistance and flexibility at the time of high-temperature environment, which is thus preferable.

For example, a cycloolefin copolymer, which is a copolymer of a repeating unit represented by the following chemical formula (4) and a repeating unit represented by the following chemical formula (5), can be used as a resin of an adhesive component.

[Chemical formula 6]

(4)

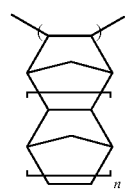

(5)

In chemical formula (5), n is 0 or an integer of 1 to 3.

As such a cycloolefin copolymer, APL 8008T, APL 8009T, and APL 6013T (all, manufactured by Mitsui Chemicals, Inc.) can be used.

Acryl-Styrene-Based Resin

As the acryl-styrene-based resin, there is exemplified a resin obtained by polymerizing styrene or a styrene derivative with a (meth)acrylic acid ester using these components as monomers.

Examples of the (meth)acrylic acid ester include a (meth)acrylic acid alkyl ester having a chain structure, a (meth)acrylic acid ester having an aliphatic ring, and a (meth)acrylic acid ester having an aromatic ring. Examples of the (meth)acrylic acid alkyl ester having a chain structure include an acryl-based long-chain alkyl ester having an alkyl group having 15 to 20 carbon atoms and an acryl-based alkyl ester having an alkyl group having 1 to 14 carbon atoms. As the acryl-based long-chain alkyl ester, there is exemplified an alkyl ester of acrylic acid or methacrylic acid in which the alkyl group is a n-pentadecyl group, a n-hexadecyl group, a n-heptadecyl group, a n-octadecyl group, a n-nonadecyl group, or a n-eicosyl group. Here, this alkyl group may be a branched alkyl group.

As the acryl-based alkyl ester having an alkyl group having 1 to 14 carbon atoms, there is exemplified a commonly known acryl-based alkyl ester that is used in an existing acryl-based adhesive. For example, there is exemplified an alkyl ester of acrylic acid or methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, or a tridecyl group.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate. Among these, isobornyl methacrylate and dicyclopentanyl (meth) acrylate are more preferable.

The (meth)acrylic acid ester having an aromatic ring is not particularly limited, but examples of the aromatic ring include a phenyl group, a benzyl group, a tolyl group, a xylyl group, a biphenyl group, a naphthyl group, an anthracenyl group, a phenoxymethyl group, and a phenoxyethyl group. The aromatic ring may have a linear or branched alkyl group having 1 to 5 carbon atoms. Specifically, phenoxyethyl acrylate is more preferable.

Maleimide-Based Resin

Examples of the maleimide-based resin include resins obtained by polymerizing: maleimides having an alkyl group, such as N-methyl maleimide, N-ethyl maleimide, N-n-propyl maleimide, N-isopropyl maleimide, N-n-butyl maleimide, N-iso-butyl maleimide, N-sec-butyl maleimide, N-tert-butyl maleimide, N-n-pentyl maleimide, N-n-hexyl maleimide, N-n-heptyl maleimide, N-n-octyl maleimide, n-lauryl maleimide, and N-stearyl maleimide; maleimides having an aliphatic hydrocarbon group, such as N-cyclopropyl maleimide, N-cyclobutyl maleimide, N-cyclopentyl maleimide, N-cyclohexyl maleimide, N-cycloheptyl maleimide, and N-cyclooctyl maleimide; and aromatic maleimides having an aryl group, such as N-phenyl maleimide, N-m-methyl phenyl maleimide, N-o-methyl phenyl maleimide, and N-p-methyl phenyl maleimide, as monomers.

Elastomer

The elastomer is preferably an elastomer containing a styrene unit as a structural unit of a main chain, and the "styrene unit" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group. The content of the styrene unit is preferably within the range of 14% by weight to 50% by weight. The weight average molecular weight of the elastomer is preferably within the range of 10,000 to 200,000.

If the content of the styrene unit is within the range of 14% by weight to 50% by weight and the weight average molecular weight of the elastomer is within the range of 10,000 to 200,000, the elastomer is easily dissolved in the following hydrocarbon-based solvent, and thus the adhesive layer can be removed more easily and rapidly. Further, if the content of the styrene unit is within the above range and the weight average molecular weight of the elastomer is within the above range, a wafer exhibits excellent resistance to a resist solvent (for example, PGMEA, PGME, etc.), acid (hydrofluoric acid, etc.), or alkali (TMAH, etc.) which is exposed when the wafer is subjected to a resist lithography process.

The elastomer may be mixed with the above-described (meth)acrylic acid ester.

The content of the styrene unit is more preferably 17% by weight or more, and is more preferably 40% by weight or less.

The weight average molecular weight of the elastomer is more preferably within the range of 20,000 or more, and is more preferably within the range of 150,000 or less.

As the elastomer, various elastomers can be used if the content of the styrene unit is within the range of 14% by weight to 50% by weight and the weight average molecular weight of the elastomer is within the range of 10,000 to 200,000. Examples of the elastomer include a polystyrene-poly(ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof; and a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), styrene-ethylene-ethylene-propylene-styrene block copolymers having a reaction-crosslinked styrene block (Septon V9461 (manufactured by KURARAY CO., LTD.) and Septon V9475 (manufactured by KURARAY CO., LTD.)), a styrene-ethylene-butylene-styrene block copolymer having a reaction-crosslinked styrene block (Septon V9827 having a reactive polystyrene-based hard block (manufactured by KURARAY CO., LTD.)), and a polystyrene-poly(ethylene-ethylene/propylene) block-polystyrene block copolymer (SEEPS-OH: terminal hydroxyl group-modified). Elastomers having s styrene unit content and a weight average molecular weight within the above ranges can be used.

Among the elastomers, the hydrogenated products are preferable. In the case of the hydrogenated products, stability to heat is improved, and alteration, such as decomposition or polymerization is difficult to occur. The hydrogenated products are more preferable even from the viewpoint of solubility to a hydrocarbon-based solvent and resistance to a resist solvent.

Among these elastomers, a elastomer having styrene block polymers at both ends thereof is more preferable. The reason for this is that the elastomer exhibits higher heat resistance by block-polymerizing styrene having high thermal stability at both ends thereof.

More specifically, the elastomer is more preferably a hydrogenated product of a block copolymer of styrene and a conjugated diene. In this case, stability to heat is improved, and alteration, such as decomposition or polymerization, is difficult to occur. Further, the elastomer exhibits higher heat resistance by block-polymerizing styrene having high thermal stability at both ends thereof. Moreover, this elastomer is more preferable from the viewpoint of solubility to a hydrocarbon-based solvent and resistance to a resist solvent.

Examples of commercially available products that can be used as the elastomer contained in the adhesive constituting the adhesive layer 3 may include "SEPTON (trade name)" manufactured by KURARAY CO., LTD., "HYBRAR (trade name)" manufactured by KURARAY CO., LTD., "TUFTEC (trade name)" manufactured by Asahi Kasei Corporation, and "DYNARON (trade name)" manufactured by JSR Corporation.

The content of the elastomer contained in the adhesive constituting the adhesive layer 3, for example, is preferably within the range of 50 parts by weight to 99 parts by weight, more preferably within the range of 60 parts by weight to 99 parts by weight, and most preferably within the range of 70 parts by weight to 95 parts by weight, with respect to 100 parts by weight of the total amount of the adhesive composition. If the content thereof is within the above range, it is possible to appropriately bond the wafer and the support while maintaining heat resistance.

Further, the elastomer may be a mixture of a plurality of kinds. That is, the adhesive constituting the adhesive layer 3 may contain a plurality of kinds of elastomers. At least one of the plurality of kinds of elastomers may contain a styrene unit as a structural unit of a main chain. At least one of the plurality of kinds of elastomers is included within the scope of the present invention if it has a styrene unit content within the range of 14% by weight to 50% by weight and a weight average molecular weight of 10,000 to 200,000. Further, in the case where the adhesive constituting the adhesive layer 3 contains the plurality of kinds of elastomers, as a mixed result, the content of the styrene unit may be adjusted to be within the above range. For example, if SEPTON 4033 (trade name, manufactured by KURARAY CO., LTD.) having a styrene unit content of 30% by weight and SEPTON 2063 (trade name, manufactured by KURARAY CO., LTD.) having a styrene unit content of 13% by weight are mixed at weight ratio of 1 to 1, the content of styrene to the total elastomer contained in the adhesive becomes 21% by weight to 22% by weight, and thus becomes 14% by weight or more. Further, for example, if SEPTON having a styrene unit content of 10% by weight and SEPTON having a styrene unit content of 60% by weight are mixed at weight ratio of 1 to 1, the content of styrene to the total elastomer contained in the adhesive becomes 35% by weight, and thus becomes within the above range. The present invention may be configured in such a form. Meanwhile, it is most preferable that all of the plurality of kinds of elastomers contained in the adhesive constituting the adhesive layer 3 contain a styrene unit within the above range and have a weight average molecular weight within the above range.

It is preferable that the adhesive layer 3 is formed using a resin other than photocurable resins (for example, UV-curable resins). If a resin other than photocurable resins is used, it is possible to prevent residues from remaining in the vicinity of minute unevenness of the supported substrate after peeling or removing the adhesive layer 3. In particular, as the adhesive constituting the adhesive layer 3, an adhesive soluble in a specific solvent, not soluble in any solvent, is preferable. The reason for this is that the adhesive layer 3 can be removed by dissolving the adhesive layer 3 in a solvent without applying physical force to the substrate 1. In this case, the adhesive layer 3 can be easily removed even from the substrate 1, the strength of which is lowered upon the removal of the adhesive layer 3, without damaging or deforming the substrate 1.

Other Components

The adhesive constituting the adhesive layer 3 may further contain other materials having miscibility within the range that does not impair essential properties. For example, commonly-used various additives, such as additional resins for improving the performance of the adhesive, a plasticizer, an adhesion auxiliary agent, a stabilizer, a colorant, a thermal polymerization inhibitor, and a surfactant, can be further used.

As the dilution solvent that is used at the time of forming the adhesive layer 3, usable is a dilution solvent which is the same as the solvent for preparing the solution of the above-described composition containing a reactive polysilsesquioxane and a crosslinkable group-containing siloxane.

Laminating Process

As shown in (e) of FIG. 1, the laminating process is a process for forming the laminate 10.

In the laminating process, the substrate 1 provided with the adhesive layer 3 and the support plate 2 provided with the release layer 4 are superimposed in order of the substrate 1, the adhesive layer 3, the release layer 4, and the support plate 2 under a vacuum condition while heating the adhesive layer 3. Then, pressure force is applied by tucking the superimposed substrate 1 and support plate 2 by a pair of plate members provided with a bonding apparatus for bonding a laminate. Thereby, the laminate 10 can be formed. The conditions for forming the laminate 10 may be appropriately adjusted depending on the kind of an adhesive layer and the size of a laminate.

Laminate 10

As described later, the laminate 10 prepared by the method of preparing a laminate according to the present embodiment is also included within the scope of the present invention.

As shown in (e) of FIG. 1, the substrate 1 of the laminate 10, as an example, is thinning-treated to a predetermined thickness by a grinding unit such as a grinder. Further, for example, in the TSV (Through Silicone Via) process, the laminate 10 is configured such that a through electrode can be formed through a photolithography process. Since the laminate 10 is provided with the release layer 4 formed by polymerizing the reactive polysilsesquioxane and the crosslinkable group-containing siloxane and having high chemical resistance, it is possible to appropriately prevent the entire release layer 4 containing an edge portion from being damaged by various chemicals used in the TSV process. Further, even when high-temperature treatment is performed with respect to the laminate 10, the entire release layer 4 containing an edge portion is altered, thereby preventing voids from being generated between the adhesive layer 3 and the support plate 2. Moreover, it is possible to prevent the edge portion of the release layer 4 from being peeled in the dipping of chemicals in the TSV process, and it is possible to prevent a problem that an adhesive is fluidized in a subsequent thermal process, and the substrate 1 and the support plate 2 are directly re-bonded by the fluidized adhesive, thereby making it difficult to strip the support plate 2 from the substrate 1.

Further, if the laminate 10 is provided with an adhesive layer 3 containing a polysulfone resin, for example, this laminate 10 can be appropriately used even in the high-temperature process in which the laminate 10 is treated by annealing at a high temperature of 300° C. or higher.

Further, in the laminate 10, both the substrate 1 and the support plate 2 are made of silicon, thereby making the thermal expansion coefficients of the substrate 1 and the support plate 2 to be substantially equal to each other. Therefore, when the laminate 10, for example, is heated in the TSV process or high-temperature process, it is possible to reduce the distortion caused by the difference in thermal expansion coefficient between the substrate 1 and the support plate 2. Accordingly, it is possible to perform various processes on the substrate 1 with high accuracy.

Method of Treating Substrate

Next, a method of treating a substrate according to an embodiment of the present invention will be described. The method of treating a substrate according to an embodiment of the present invention includes: a laminate preparing process of preparing a laminate 10 by the method of preparing a laminate according to an embodiment of the present invention (refer to (a) to (e) of FIG. 1); and a separation process of, after the laminate preparing process, irradiating the release layer 4 with light to thereby alter the release layer 4 and separating the support plate 2 from the laminate 10 (refer to (f) and (g) of FIG. 1).

Since the release layer can be decomposed by irradiation with light, the damage or deformation of the support plate can be prevented, and the support plate and the adhesive layer can be easily separated.

Separation Process

As shown in (f) of FIG. 1, in the separation process, the release layer 4 is irradiated with light through the support plate 2. Accordingly, the release layer 4 of the laminate 10 is altered, so as to separate the substrate 1 and the support plate 2 ((g) of FIG. 1). Further, in the separation process, for example, the surface of the substrate 1 in the laminate 10 after performing a desired treatment may be bonded to a dicing tape, and the release layer 4 may be irradiated with light from the side of the support plate 2. Accordingly, subsequent processes can be performed while preventing the substrate 1 having been subjected to a thinning treatment from being damaged.

In the laser emitting light to be applied to the release layer 4, typically, infrared light (0.78 µm to 1000 µm), preferably far-infrared light (3 µm to 1000 µm), and more preferably light having a wavelength of 9 µm to 11 µm is used. Specifically, the laser is a $CO_2$ laser. When the $CO_2$ laser is used, light can transmit silicon, and can be absorbed in the release layer 4 composed of a polymer of the reactive polysilsesquioxane and the crosslinkable group-containing siloxane. Thus, the release layer 4 is irradiated with light from the side of the support plate 2 of the laminate 10, thereby altering the release layer 4 to make the release layer 4 brittle against the external force. Accordingly, for example, the substrate 1 in the laminate 10 is fixed to a mounting stage of a support separation apparatus, the support plate 2 is held by an adsorption pad, and slight force is applied, thereby separating the support plate 2 and the substrate 1. Further, for example, the substrate 1 and the support plate 2 can be separated by applying a force by gripping the chamfered portion of end of periphery of the support plate 2 using a separation plate provided with a clamp (claw portion).

In the laminate 10 according to the present embodiment, since the substrate 1 made of silicon is used, the release layer 4 is irradiated with light having a wavelength of 9 µm to 11 µm from the surface of side of the substrate 1, and thus the release layer 4 is altered, thereby separating the substrate 1 and the support plate 2.

According to laser light irradiation conditions in the separation process, the average output value of laser light is preferably 1.0 W to 5.0 W, and more preferably 3.0 W to 4.0 W. The repetition frequency of laser light is preferably 20 kHz to 60 kHz, and more preferably 30 kHz to 50 kHz. The scanning speed of laser light is preferably 100 mm/s to 10,000 mm/s. Thus, it is possible to set the laser light irradiation conditions to appropriate conditions for altering the release layer 4. Further, the beam spot diameter of pulsed light and the irradiation pitch of pulsed light may be a pitch at which the release layer 4 can be altered without overlapping adjacent beam spots each other.

Other Processes

Other processes, such as a cleaning process and a dicing process, are carried out on the substrate 1 from which the support plate 2 was separated. Thus, a semiconductor chip is prepared from the substrate 1.

In the cleaning process, the residues of the adhesive layer 3 remaining on the substrate 1 and the residues of the release layer 4 are removed by a solvent. As the method for cleaning the substrate 1, the substrate 1 may be cleaned by supplying a solvent to the substrate 1 by spraying the solvent while spinning the substrate 1. In addition, the substrate 1 may be cleaned by dipping the substrate 1 into the solvent.

Thereafter, the substrate 1, from which the adhesive layer 3 and the release layer 4 were removed by the cleaning process, is diced, so as to prepare a semiconductor chip.

Another Embodiment

The method of preparing a laminate according to the present invention is not limited to the above-described embodiment. For example in a method of preparing a laminate according to another embodiment, as the substrate, any substrate of a ceramic substrate, a thin film substrate, and a flexible substrate is used, and, as the support, a support plate made of silicon is used.

Even by the above-described configuration, a release layer can be formed on a support plate by polymerizing the reactive polysilsesquioxane and the crosslinkable group-containing siloxane. Accordingly, the release layer itself has high chemical resistance, and thus a laminate provided with the release layer having high chemical resistance and high heat resistance can be prepared. Further, the release layer can be altered by irradiation with light having a wavelength falling within the range of 9 µm to 11 µm through the support plate. Therefore, the laminate, which is prepared by the method of preparing a laminate according to the present embodiment, and the method of treating a substrate, which includes a laminate-preparing process of preparing a laminate by the method of preparing a laminate according to the present embodiment, are also included within the scope of the present invention.

In a method of preparing a laminate according to still another embodiment, as the substrate, a substrate made of silicon is used, and, as the support, a support plate made of glass or acryl-based resin is used.

Even by the above-described configuration, a laminate provided with a release layer formed by a polymer of the reactive polysilsesquioxane and the crosslinkable group-containing siloxane can be prepared, and the laminate is configured such that the substrate and the support plate can be appropriately separated by irradiating the release layer with light through the substrate. Therefore, the laminate, which is prepared by the method of preparing a laminate according to the present embodiment, and the method of treating a substrate, which includes a laminate-preparing process of preparing a laminate by the method of preparing a laminate according to the present embodiment, are also included within the scope of the present invention.

In a method of preparing a laminate according to still another embodiment, in the process of forming a release layer, the composition containing the reactive polysilsesquioxane and the crosslinkable group-containing siloxane is applied onto a substrate, and then heated to polymerize the containing the reactive polysilsesquioxane and the crosslinkable group-containing siloxane, and thereby a release layer capable of being altered by absorbing light may be formed.

Even by the above-described configuration, in a subsequent separation process, it is possible to prepare a laminate that can appropriately separate the substrate and the support plate. Further, in the separation process, when the substrate and the support plate are separated from the laminate, it is possible to prevent the residues of an adhesive layer from remaining on the substrate. Therefore, the cleaning of the substrate can be more appropriately performed.

Composition for Forming Release Layer

A composition for forming a release layer according to an embodiment of the present invention contains a reactive polysilsesquioxane and a crosslinkable group-containing siloxane. Here, the reactive polysilsesquioxane and the crosslinkable group-containing siloxane are the same as the above-described ones.

The crosslinkable group-containing siloxane is preferably epoxy siloxane, considering the physical properties (laser reactivity, heat resistance, etc.) of a release layer and/or a laminate at the time of forming a release layer and forming a laminate containing this release layer.

The content of the crosslinkable group-containing siloxane is 10% by weight to 99% by weight, and preferably 20% by weight to 80% by weight, with respect to the total weight of the reactive polysilsesquioxane and the crosslinkable group-containing siloxane.

The composition for forming a release layer may contain a thermal acid generator as a polymerization initiator, considering that the release layer is formed by heating the composition to polymerize the reactive polysilsesquioxane and the crosslinkable group-containing siloxane contained in the composition. The thermal acid generator may be the same as the above-described one. It is preferable that the thermal acid generator is contained in an amount of 0.01% by weight to 5% by weight with respect to the total weight of the composition for forming a release layer.

Release Layer

The release layer according to an embodiment of the present invention is a release layer which is composed of the above-described composition for forming a release layer according to an embodiment of the present invention and is capable of being altered (becomes brittle) by absorbing light.

More specifically, the release layer is composed of a polymer of the reactive polysilsesquioxane and the crosslinkable group-containing siloxane contained in the composition for forming a release layer.

Since the release layer is composed of a polymer of the reactive polysilsesquioxane and the crosslinkable group-containing siloxane contained, the release layer itself has high chemical resistance.

Laminate

The laminate according to an embodiment of the present invention includes a substrate, a support transmitting light, an adhesive layer, and the release layer according to an embodiment of the present invention, and is formed by laminating the substrate and the support through the adhesive layer and the release layer. Here, the components (substrate, support (support plate), adhesive layer, etc.) of the laminate may be the same as ones of the laminate 10 prepared by the above-described method of preparing a laminate according to an embodiment of the present invention.

Since the release layer itself according to an embodiment of the present invention has high chemical resistance, the edge portion of the release layer of the laminate is not peeled by the dipping of chemicals in the TSV process. For this reason, it is possible to prevent a problem that an adhesive is fluidized in a subsequent thermal process, and the substrate 1 and the support plate 2 are directly re-bonded by the fluidized adhesive, thereby making it difficult to strip the support plate 2 from the substrate 1.

In order to appropriately use the adhesion of the laminate in the process of preparing a semiconductor device, the die shear strength of the laminate is preferably about 30 N or more, and more preferably about 50 N to about 80 N.

Hereinafter, embodiments of the present invention will be described in more detail with reference to the following Examples. Of course, the present invention is not limited to each of the above-described embodiments, and may be variously modified within the scope of claims, and an embodiment obtained by the appropriate combination of technical means disclosed in different embodiments is also included in the technical scope of the present invention.

EXAMPLES

A release layer formed by polymerizing the reactive polysilsesquioxane and the crosslinkable group-containing siloxane, and a laminate including the release layer were prepared, and the chemical resistance, laser reactivity and die shear strength thereof were measured.

Examples 1 to 16

Preparation of Release Layer

First a solution for preparing a release layer was prepared.

As the reactive polysilsesquioxane, SR-21 represented by formula (6) below (manufactured by KONISHI CHEMICAL IND CO., LTD.) was used. As the crosslinkable group-containing siloxane, the crosslinkable group-containing siloxane A represented by formula (7) below (mass average molecular weight: 3,000, in formula (7), m=50 mol % to 90 mol %, n=10 mol % to 50 mol %) and the epoxycyclohexyl group-containing siloxane (trade name: X-22-2046 manufactured by Shin-Etsu Silicone Co., Ltd. (viscosity: 45 mm$^2$/g, specific gravity (25° C.): 0.96, refractive index (25° C.): 1.474, equivalent in terms of the functional group: 600 g/mol)) were used.

[Chemical formula 7]

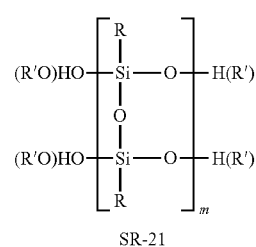

SR-21

[Chemical formula 8]

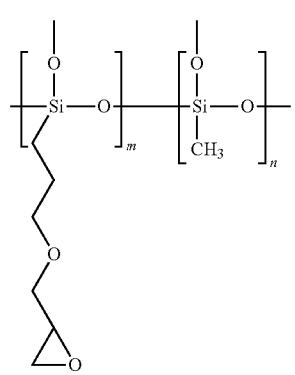

Crosslinkable group-containing siloxane A

The SR-21 and the crosslinkable group-containing siloxane A were mixed at weight ratios of SR-21: crosslinkable group-containing siloxane A of 80:20, 70:30, 60:40, and 50:50 to thereby obtain respective compositions, CXC-1821 (manufactured by KING INDUSTRY CO., LTD.), as a thermal acid generator, was added to the respective compositions in an amount of 0.1% by weight with respect to the total weight of the composition, and the resulting composition was dissolved in PGMEA, as a solvent, such that the solid concentration becomes 40% by weight, thereby obtaining composition solutions for forming a release layer A1 to A4.

Composition solutions for forming a release layer B1 to B4 were obtained in the same manner as in the preparation of the composition solutions for forming a release layer A1 to A4, except that X-22-2046 (trade name, manufactured by Shin-Etsu Silicone Co., Ltd.) was used as the crosslinkable group-containing siloxane instead of the crosslinkable group-containing siloxane A. The reactive polysilsesquioxane and the crosslinkable group-containing siloxane contained in each of the composition solutions for forming a release layer are summarized in Table 1 below. In Table 1 below, the numerical values in parentheses indicate parts by weight.

TABLE 1

Reactive polysilsesquioxane and crosslinkable group-containing siloxane contained in composition solution for forming release layer

| Composition solution for forming release layer | Reactive polysilsesquioxane (parts by weight) | Crosslinkable group-containing siloxane (parts by weight) |
| --- | --- | --- |
| A1 | SR-21 (80) | Crosslinkable group-containing siloxane A (20) |
| A2 | SR-21 (70) | Crosslinkable group-containing siloxane A (30) |
| A3 | SR-21 (60) | Crosslinkable group-containing siloxane A (40) |
| A4 | SR-21 (50) | Crosslinkable group-containing siloxane A (50) |
| B1 | SR-21 (80) | X-22-2046 (20) |
| B2 | SR-21 (70) | X-22-2046 (30) |
| B3 | SR-21 (60) | X-22-2046 (40) |
| B4 | SR-21 (50) | X-22-2046 (50) |

Formation of Release Layer

A silicon support plate of 12 inches was provided, each of the composition solutions for forming a release layer A1 to A4 and B1 to B4 was applied onto the silicon support plate, and the silicon plate coated with each of the composition solutions A1 to A4 and B1 to B4 was heated (baked) under two kinds of conditions shown below, so as to obtain release layers. The thickness of each of the release layers was unified in 2 μm. The thickness of the silicon support plate was 770 μm.

In the process of forming a release layer, heating (baking) conditions are as follows.

(1) Heating was carried out at 60° C. for 1 hour. In this case, PGMEA, which is a solvent of the composition solution for forming a release layer, was only evaporated, and the curing of the composition for forming a release layer due to the polymerization of SR-21, crosslinkable group-containing siloxane A, and X-22-2046 did not occur.

(2) Heating was carried out at 90° C. for 3 minutes, followed by heating at 160° C. for 3 minutes and then heating at 220° C. for 3 minutes. In this case, the curing of the composition for forming a release layer due to the polymerization of SR-21, crosslinkable group-containing siloxane A, and X-22-2046 occurred.

The release layers obtained in the above process were sequentially indicated as release layers 1 to 16.

Evaluation of Chemical Resistance

Each of the release layers 1 to 16 was dipped into PGMEA at 23° C. for 10 minutes to measure the decrement of the film constituting the release layer, thereby evaluating the chemical resistance thereof. In addition, each of the release layers 1 to 16 was dipped into N-methyl-2-pyrrolidone (NMP) at 60° C. for 10 minutes to measure the decrement of the film constituting the release layer, thereby evaluating the chemical resistance thereof.

For each of the release layers, the heating (baking) conditions and the results of evaluation of chemical resistance are summarized in Tables 2 and 3 below. As the test results of chemical resistance, a case where the weight of the film constituting the release layer does not decrease is rated as "A", a case where the decrement in the weight of the film is less than 50% by weight of weight of the film before the test, that is, a case where the film remains in an amount of 50% or more after the dipping into PGMEA or NMP is rated as "B", and a case where the decrement in the weight of the film is 50% by weight or more of the weight of the film before the test is rated as "C". In the case of "C", the film scarcely remained.

TABLE 2

Chemical resistance of release layer using crosslinkable group-containing polysiloxane A as crosslinkable group-containing siloxane

| | | Composition solutions for forming | Baking | Chemicals used in chemical resistance test | |
| --- | --- | --- | --- | --- | --- |
| Examples | Release layers | release layer | conditions | PGMEA | NMP |
| Example 1 | Release layer 1 | A4 | (1) | C | C |
| Example 2 | Release layer 2 | A4 | (2) | A | A |
| Example 3 | Release layer 3 | A3 | (1) | C | C |
| Example 4 | Release layer 4 | A3 | (2) | B | B |
| Example 5 | Release layer 5 | A2 | (1) | C | C |
| Example 6 | Release layer 6 | A2 | (2) | B | B |
| Example 7 | Release layer 7 | A1 | (1) | C | C |
| Example 8 | Release layer 8 | A1 | (2) | B | B |

TABLE 3

Chemical resistance of release layer using X-22-2046 as crosslinkable group-containing siloxane

| | | Composition solutions for forming | Baking | Chemicals used in chemical resistance test | |
| --- | --- | --- | --- | --- | --- |
| Examples | Release layers | release layer | conditions | PGMEA | NMP |
| Example 9 | Release layer 9 | B4 | (1) | C | C |
| Example 10 | Release layer 10 | B4 | (2) | A | A |
| Example 11 | Release layer 11 | B3 | (1) | C | C |
| Example 12 | Release layer 12 | B3 | (2) | B | B |

TABLE 3-continued

Chemical resistance of release layer using X-22-2046 as crosslinkable group-containing siloxane

| Examples | Release layers | Composition solutions for forming release layer | Baking conditions | Chemicals used in chemical resistance test | |
|---|---|---|---|---|---|
| | | | | PGMEA | NMP |
| Example 13 | Release layer 13 | B2 | (1) | C | C |
| Example 14 | Release layer 14 | B2 | (2) | B | B |
| Example 15 | Release layer 15 | B1 | (1) | C | C |
| Example 16 | Release layer 16 | B1 | (2) | B | B |

Meanwhile, even in the case where dipping time into chemicals (PGMEA, NMP) was increased by several hours, evaluation results the same as the evaluation results summarized in Tables 2 and 3 above were obtained.

Comparative Examples 1 and 2

Comparative release layers 1 and 2 were prepared, and the evaluation of chemical resistance thereof was carried out in the same manner as in the above-described Examples 1 and 2, except that reactive polysilsesquioxane (SR-21) was used alone instead of reactive polysilsesquioxane (SR-21) and crosslinkable group-containing siloxane (epoxy siloxane) and the film thickness of the release layer was set to 1.6 μm.

As a result, after dipping into PGMEA or NMP, the comparative release layers 1 and 2 scarcely remained, and the decrement in the weight of the film constituting the comparative release layer 1 was 50% by weight or more of the weight of the film before the test.

Summary of Evaluation of Chemical Resistance

From the results of Examples 1 to 16 (Tables 2 and 3) and Comparative Examples 1 and 2, it was found that each of the release layers composed of a polymer of the reactive polysilsesquioxane and the crosslinkable group-containing siloxane (epoxy siloxane), which was formed by heating the composition containing the reactive polysilsesquioxane and the crosslinkable group-containing siloxane (epoxy siloxane), has its own high chemical resistance, unlike a release layer composed of a polymer of the reactive polysilsesquioxane only.

Further, in each Example, comparing the results of heating (baking) condition (1) with the results of heating (baking) condition (2), it was found that the chemical resistance of the release layer is improved by the action of a crosslinked polymer formed by the crosslinking polymerization of crosslinkable group-containing siloxane (epoxy siloxane).

Examples 17 to 32

Preparing of Laminate

TZNR (registered trademark)-A4017 (manufactured by TOKYO OHKA KOGYO CO., LTD.), as an adhesive, was applied onto a semiconductor wafer substrate (12 inch silicon) as a substrate by spin coating, and baked for 2 minutes at each of 90° C., 160° C., and 220° C. under a vacuum condition, so as to form an adhesive layer. The thickness of the semiconductor wafer substrate was 700 μm. The film thickness of the adhesive layer was 50 μm.

Subsequently, the semiconductor wafer substrate, the adhesive layer, one of the above-described release layers 1 to 16 obtained in Examples, and the silicon support plate were superimposed in this order, and pressure force of 2,000 kg was applied thereto at a temperature condition of 240° C. for 5 minutes under a vacuum condition, so as to prepare laminates 1 to 16. The laminates 1 to 16 correspond to the release layers 1 to 16.

Evaluation of Laser Reactivity

Each of the obtained laminates 1 to 16 was irradiated with $CO_2$ laser beam through the silicon support plate using the $CO_2$ laser marker ML-Z9520-T (manufactured by Keyence Corporation) under conditions of a wavelength of 9.3 μm, an output of 20 W (100%), a scanning speed of 500 mm/s to alter the release layer, and the separation of the silicon support plate from the semiconductor wafer substrate was attempted, thereby evaluating the laser reactivity of the release layer.

In the laminate after laser irradiation, in the case where the silicon support plate could be separated from the semiconductor wafer substrate, it was determined that the release layer was altered (embrittled) by the reaction caused by laser irradiation, and the laser reactivity of the release layer was evaluated by "B". The results of evaluation of the laser reactivity thereof are shown in Table 4 below.

TABLE 4

Evaluation of laser reactivity

| Examples | Laminates | Release layers | Laser reactivity |
|---|---|---|---|
| Example 17 | Laminate 1 | Release layer 1 | B |
| Example 18 | Laminate 2 | Release layer 2 | B |
| Example 19 | Laminate 3 | Release layer 3 | B |
| Example 20 | Laminate 4 | Release layer 4 | B |
| Example 21 | Laminate 5 | Release layer 5 | B |
| Example 22 | Laminate 6 | Release layer 6 | B |
| Example 23 | Laminate 7 | Release layer 7 | B |
| Example 24 | Laminate 8 | Release layer 8 | B |
| Example 25 | Laminate 9 | Release layer 9 | B |
| Example 26 | Laminate 10 | Release layer 10 | B |
| Example 27 | Laminate 11 | Release layer 11 | B |
| Example 28 | Laminate 12 | Release layer 12 | B |
| Example 29 | Laminate 13 | Release layer 13 | B |
| Example 30 | Laminate 14 | Release layer 14 | B |
| Example 31 | Laminate 15 | Release layer 15 | B |
| Example 32 | Laminate 16 | Release layer 16 | B |

As shown in Table 4 above, as the results of evaluation of laser reactivity, in all of the release layers 1 to 16, the silicon support plate could be separated from the semiconductor wafer substrate, and the laser reactivity of the release layer was evaluated by "B".

Comparative Example 3

Comparative laminates 1 and 2 were prepared in the same manner as in Examples 17 and 18, except that comparative release layers 1 and 2 were used instead of the release layers 1 and 2. Then, the laser reactivity of each of the comparative release layers 1 and 2 was evaluated. As a result, the laser reactivity of each of the release layers was evaluated by "B".

Summary of Evaluation of Laser Reactivity

From the results of Examples 17 to 32 and Comparative Example 3, it was found that the laser reactivity of the release layer which is composed of a polymer of reactive polysilsesquioxane (SR-21) and crosslinkable group-containing siloxane (epoxy siloxane) in which the content of a polymer of the reactive polysilsesquioxane was decreased was not so much reduced, compared to that of the release layer composed of a polymer of only the reactive polysilsesquioxane (SR-21).

Examples 33 to 48

Evaluation of Die Shear Strength

Each of the laminates 1 to 16 was cut to 5 mm square, and the die shear strength thereof was measured using Condor Sigma (manufactured by XYZTEC Co., Ltd.) under a room temperature condition. The die shear strength thereof was measured by pressing a portion of the silicon support plate at a speed of 100 μm/s. In the case where the die shear strength thereof is present within the range of about 60 N to about 80 N, the die shear strength thereof was evaluated by "B". The results of evaluation of the die shear strength thereof are summarized in Table 5 below.

TABLE 5

Evaluation of die shear strength

| Examples | Laminates | Die shear strength |
|---|---|---|
| Example 33 | Laminate 1 | B |
| Example 34 | Laminate 2 | B |
| Example 35 | Laminate 3 | B |
| Example 36 | Laminate 4 | B |
| Example 37 | Laminate 5 | B |
| Example 38 | Laminate 6 | B |
| Example 39 | Laminate 7 | B |
| Example 40 | Laminate 8 | B |
| Example 41 | Laminate 9 | B |
| Example 42 | Laminate 10 | B |
| Example 43 | Laminate 11 | B |
| Example 44 | Laminate 12 | B |
| Example 45 | Laminate 13 | B |
| Example 46 | Laminate 14 | B |
| Example 47 | Laminate 15 | B |
| Example 48 | Laminate 16 | B |

Comparative Example 4

Evaluation of Die Shear Strength

Die shear strength was measured in the same manner as in Example 33, except that comparative laminate 1 was used instead of the laminate 1. As a result, the evaluation result of die shear strength of the comparative laminate 1 was "B".

Summary of Evaluation of Die Shear Strength

From the results of Examples 33 to 48 and Comparative Example 4, it was found that the laminate having the release layer composed of a polymer of the reactive polysilsesquioxane and the crosslinkable group-containing siloxane (epoxy siloxane), similarly to the laminate having the release layer composed of a polymer of only the reactive polysilsesquioxane, exhibits die shear strength within the range (30 N or more, more preferably 50 N to 80 N) preferable in the use in a process of preparing a semiconductor device.

INDUSTRIAL APPLICABILITY

The present invention can be appropriately used in the process of preparing a miniaturized semiconductor device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of preparing a laminate formed by laminating a substrate and a light-transmissive support through an adhesive layer and a release layer capable of being altered by light absorption, comprising:
   applying a composition containing a reactive polysilsesquioxane and a crosslinkable group-containing siloxane onto the surface of the support or the surface of the substrate; and
   heating the composition to polymerize the reactive polysilsesquioxane and the crosslinkable group-containing siloxane,
   thereby forming the release layer on the surface of the support or the surface of the substrate,
   wherein the reactive polysilsesquioxane has a structure represented by formula (1) below:

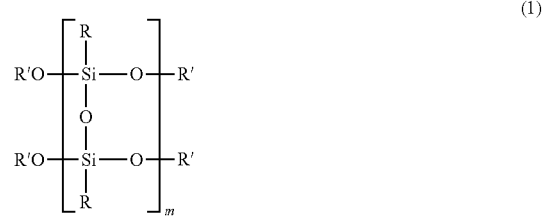

wherein each R is independently selected from the group consisting of organic groups, each R' is independently selected from the group consisting of a hydrogen atom and an alkyl group having 1 to 10 carbon atoms, and m is an integer of 1 to 100, and
the crosslinkable group-containing siloxane contains a crosslinkable group which is at least one selected from the group consisting of an epoxy group, an alkoxy group, a carboxyl group, a carbonyl group, and a hydroxyl group.

2. A method of treating a substrate, comprising:
preparing a laminate according to the method of claim 1;
irradiating the release layer with light to alter the release layer; and
separating the support from the laminate.

* * * * *